United States Patent
Tsironis

(10) Patent No.: US 10,345,422 B1
(45) Date of Patent: Jul. 9, 2019

(54) COMPACT HARMONIC TUNER SYSTEM WITH ROTATING PROBES

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 15/869,467

(22) Filed: Jan. 12, 2018

Related U.S. Application Data

(60) Provisional application No. 62/445,992, filed on Jan. 13, 2017.

(51) Int. Cl.
| | |
|---|---|
| *H03H 7/38* | (2006.01) |
| *G01R 35/00* | (2006.01) |
| *H03H 7/40* | (2006.01) |
| *G01R 27/32* | (2006.01) |
| *G01R 31/26* | (2014.01) |

(52) U.S. Cl.
CPC ........... *G01R 35/005* (2013.01); *G01R 27/32* (2013.01); *H03H 7/40* (2013.01); *G01R 31/2601* (2013.01)

(58) Field of Classification Search
CPC ........ H03H 7/38; H03H 7/40; H04L 25/0278; G01R 31/2614; G01R 31/2822
USPC ............ 333/32, 33, 17.3, 263; 324/637, 641
See application file for complete search history.

(56) References Cited

U.S. PATENT DOCUMENTS

| | | | |
|---|---|---|---|
| 6,674,293 B1 | 1/2004 | Tsironis | |
| 7,595,709 B1 | 9/2009 | Boulerne | |
| 8,405,466 B2 * | 3/2013 | Tsironis | ................... H03H 7/20 333/139 |
| 9,257,963 B1 | 2/2016 | Tsironis | |
| 9,276,551 B1 | 3/2016 | Tsironis | |
| 9,620,842 B1 | 4/2017 | Tsironis | |
| 9,625,556 B1 | 4/2017 | Tsironis | |
| 9,899,984 B1 * | 2/2018 | Tsironis | ................... H03H 7/40 |

OTHER PUBLICATIONS

"Load Pull Measurements" [online], Wikipedia [Retrieved on Nov. 18, 2016] Retrieved from Internet <URL:http://en.wikipedia.org/wiki/Load_pull>.
"Computer Controlled Microwave Tuner—CCMT", Product Note 41, Focus Microwaves Jan. 1998.
"Cam Mechanism" [online], Google Search [Retrieved on Jan. 7, 2018] Retrieved from Internet <URL: https://www.google.ca/search?dcr=0&source=hp&ei=7jZWWv_ZI-SfjwTlspSwAg&q=cam+mechanisim&oq=cam+mechanisim&gs_l=psy-ab.3..0i10k1l10.3174.7778.0.8197.14.12.0.2.2.0.190.1513.1j11.12.0....0...1c.1.64.psy-ab..0.14.1561...0j0i131k1.0.pv0ojRndObU>.
"Lecture 20: Transmission (ABCD) Matrix" [online], EE 481/581—Microwave Engineering, Course Syllabus [Retrieved on Jul. 13, 2015] Retrieved from Internet <URL: http://whites.sdsmt.edu/classes/ee481/notes/481Lecture20.pdf>.

* cited by examiner

*Primary Examiner* — Stephen E. Jones

(57) ABSTRACT

A compact harmonic tuner system uses a two-carriage harmonic slide-screw impedance tuner employs, single and dual frequency band metallic disc probes travelling along and rotating diametrically inside the same slabline, which therefore is only one half, instead of full, the wavelength long at the minimum frequency of operation. Using disc probes allows probe control operation without high precision vertical axes, as well as high resolution in the area where the gap between center conductor and probe is small (high GAMMA), a smooth increase of proximity between probe and center conductor and the possibility to compensate for the negative phase slope at higher GAMMA, native to traditional slide screw tuners using vertically moving square probes (slugs).

4 Claims, 13 Drawing Sheets

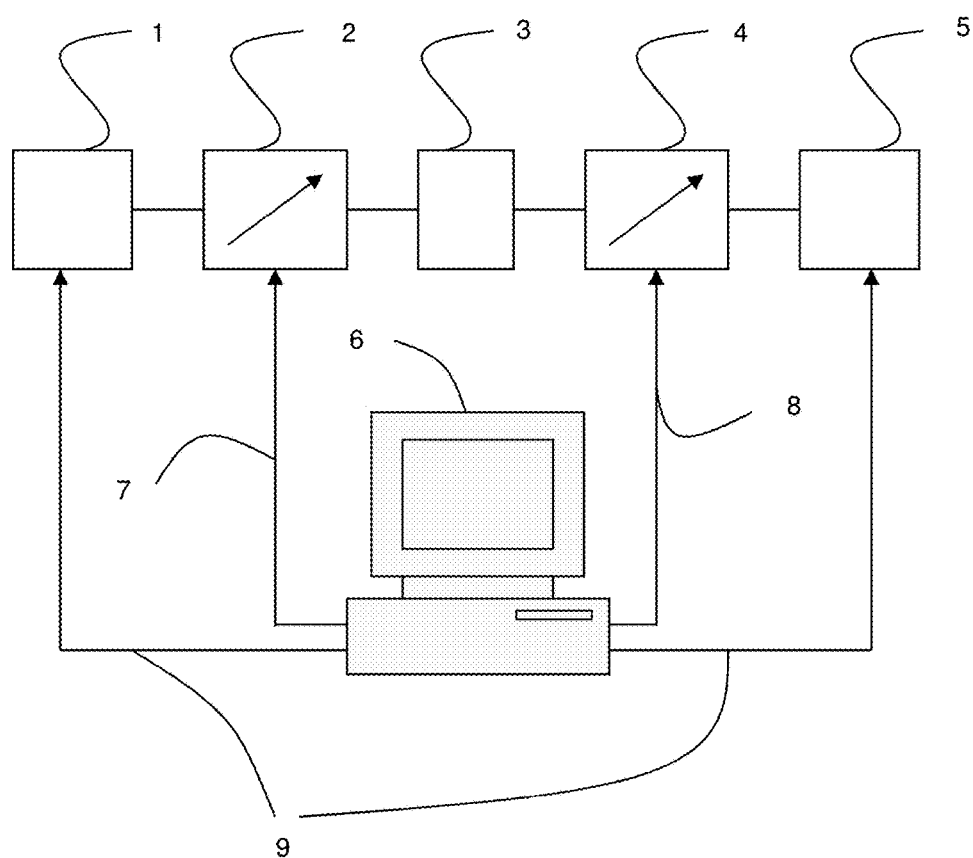
FIG. 1: Prior art

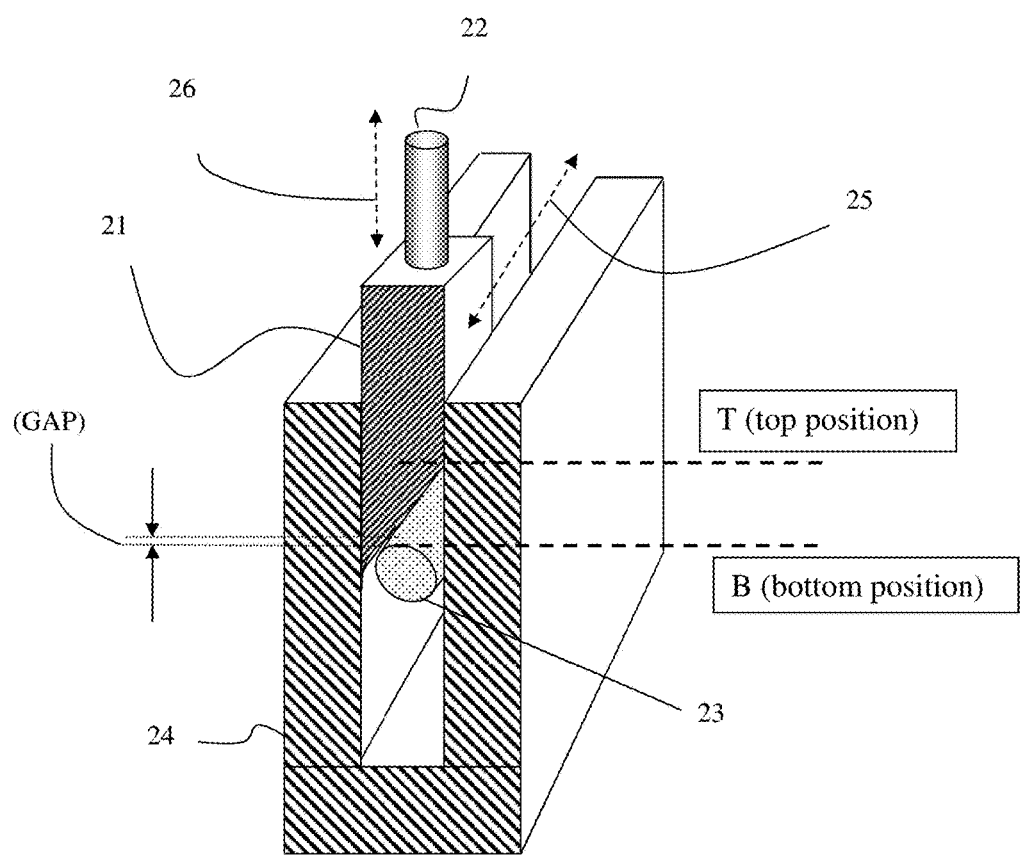
FIG.2: Prior art

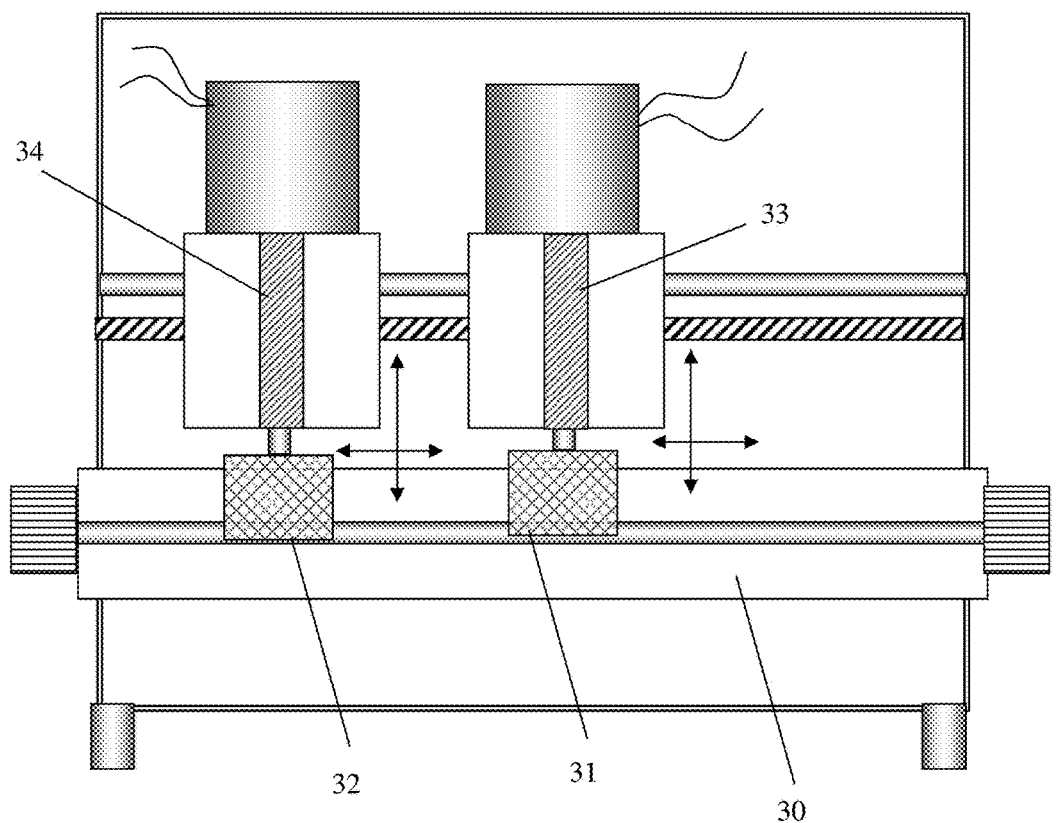
FIG. 3: Prior art

FIG. 4A: Prior art
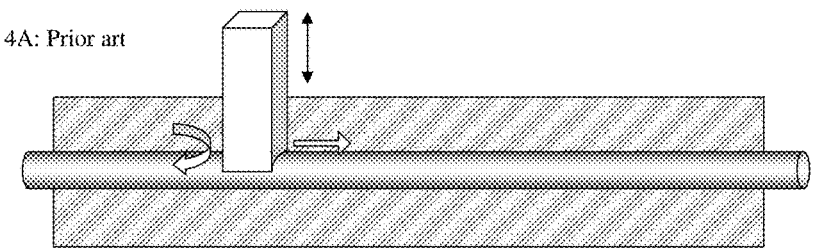
FIG. 4B: Prior art
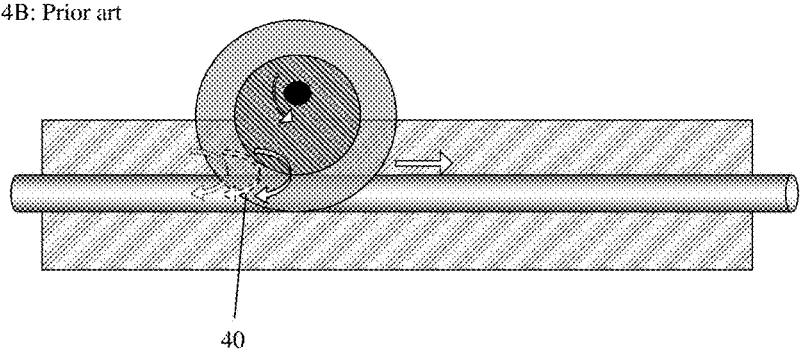
40

FIG. 5A: Prior art
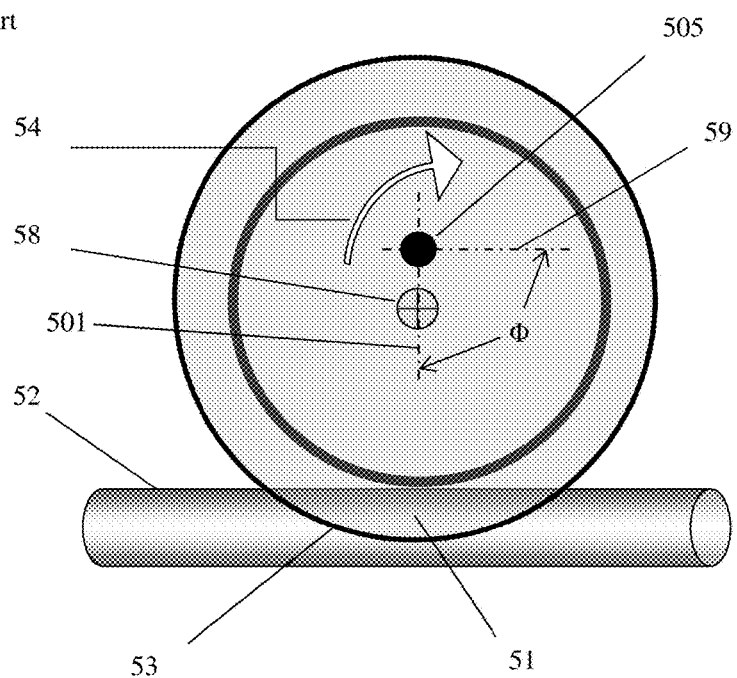
FIG. 5B: Prior art
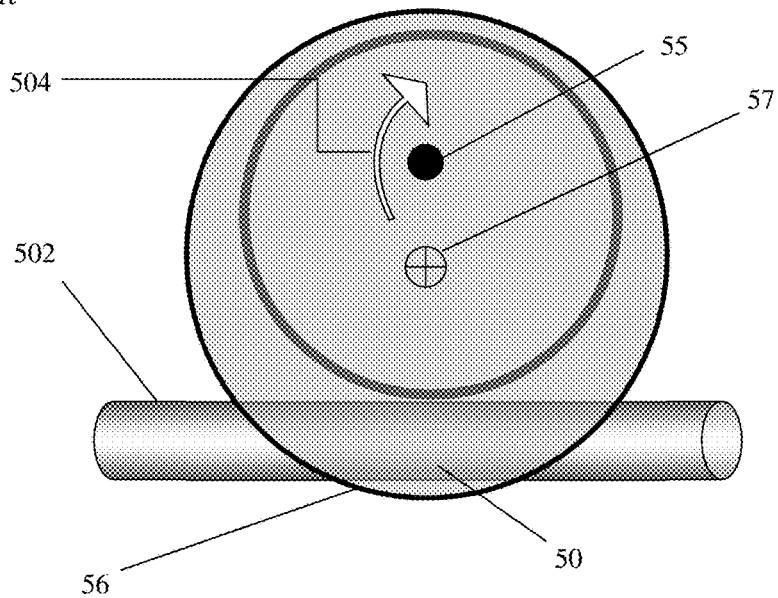

FIG. 9A
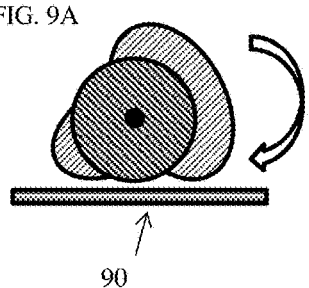
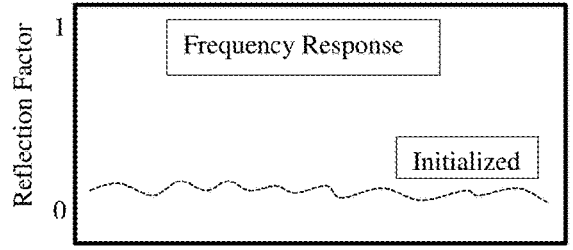
90
FIG. 9B
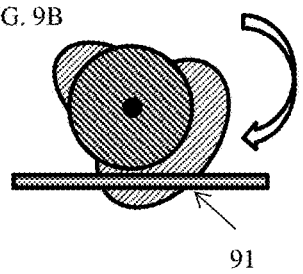
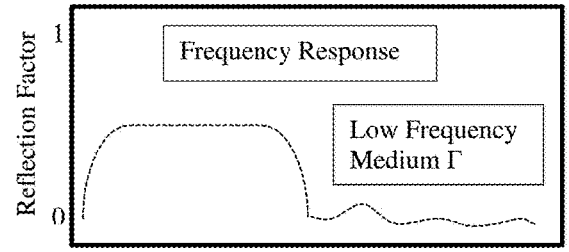
91
FIG. 9C
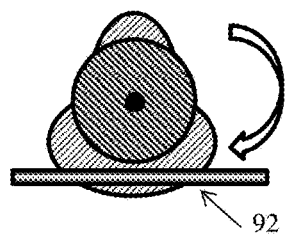
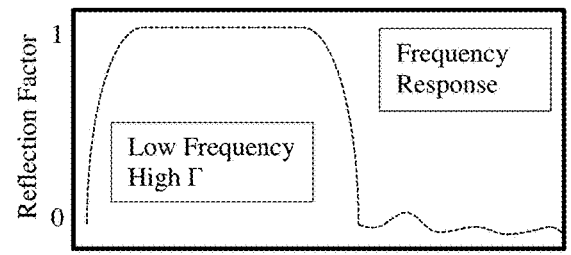
92
FIG. 9D
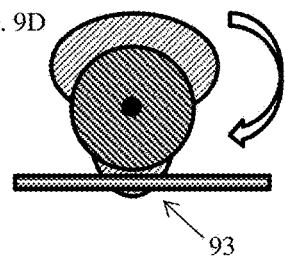
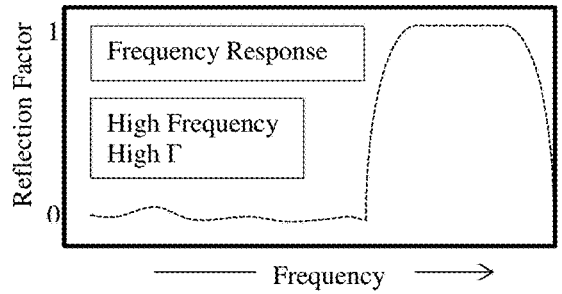
93

COMPACT HARMONIC TUNER SYSTEM WITH ROTATING PROBES

PRIORITY CLAIM

This application claims priority on provisional application 62/445,992, titled "Compact Harmonic Tuner with rotating probes", filed on Jan. 13, 2017.

CROSS-REFERENCE TO RELATED ARTICLES

1. "Load Pull Measurements" [online], Wikipedia [Retrieved on Nov. 18, 2016] Retrieved from Internet <URL:http://en.wikipedia.org/wiki/Load_pull>
2. "Computer Controlled Microwave Tuner—CCMT", Product Note 41, Focus Microwaves January 1998
3. Boulerne P., U.S. Pat. No. 7,595,709, Multiple-Carriage High Gamma Tuner"
4. Tsironis C., U.S. Pat. No. 6,674,293, "Adaptable Pre-Matched Tuner System and Method"
5. Tsironis C., U.S. Pat. No. 9,276,551, "Impedance Tuner with Rotating Multi-Section Probes"
6. Tsironis C., U.S. Pat. No. 9,620,842, "Compact Two Probe Impedance Tuner"
7. Tsironis C., U.S. Pat. No. 9,257,963, "Impedance Tuners with Rotating Probes"
8. Tsironis C., U.S. Pat. No. 9,625,556, "Method for Calibration and Tuning with Impedance Tuners".
9. "Cam Mechanism" [online], Google Search [Retrieved on Jan. 7, 2018] Retrieved from Internet <URL: https://www.google.ca/search?dcr=0&source=hp&ei=7jZWWv_ZI-SfjwTIspSwAg&q=cam+mechanisim&oq=cam+mechanisim&gs_1=psy-ab.3 . . . 0i10k1110.3174.7778.0.8197.14.12.0.2.2.0.190.1 513.1j11.12.0 . . . 0 . . . 1c.1.64.psy-ab . . . 0.14.15 61 . . . 0j0i131k1.0.pv0ojRndObU>
10. "Lecture 20: Transmission (ABCD) Matrix" [online], EE 481/581—Microwave Engineering, Course Syllabus [Retrieved on Jul. 13, 2015] Retrieved from Internet <URL: http://whites.sdsmt.edu/classes/ee481/notes/481Lecture20.pdf>

BACKGROUND OF THE INVENTION

This invention relates to RF load and source pull testing of medium and high power RF transistors and amplifiers using remote controlled electro-mechanical impedance tuners. Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models only.

A popular method for testing and characterizing such microwave components (transistors) in the non-linear region of operation is "load pull" (see ref. 1). Load pull is a measurement technique employing microwave tuners and other microwave test equipment as shown in FIG. 1. The microwave tuners 2, 4 are used in order to manipulate the microwave impedance conditions under which the Device Under Test (DUT, or transistor, 3) is tested, see ref. 1; the signal is provided by a signal source 1 and the outcoming power is measured by a power meter 5; the whole is controlled by a PC 6, which comprises interfaces to communicate with the instruments and the tuners, using digital cables 7, 8 and 9. This document refers hence to "impedance tuners", see ref. 2, in order to make a clear distinction to "tuned receivers (radios)", popularly called elsewhere also "tuners" because of the included tuning circuits.

Two-carriage impedance tuners comprise, in general, a transmission line 30, FIG. 3, and a number of conductive tuning elements (probes, 31, 32) attached 22 on adjustable vertical axes 33, 34, which, when approaching 26 the center conductor 23 of the slabline 24 (FIG. 2) and moved 25 along the axis of the slabline, create a variable reactance, allowing thus the synthesis of various impedances (or reflection factors) covering parts or the totality of the Smith chart (the normalized reflection factor area). The relation between reflection factor and impedance is given by GAMMA=(Z−Zo)/(Z+Zo), where Z is the complex impedance Z=R+jX and Zo is the characteristic impedance. A typical value used for Zo is 50Ω.

When cubical metallic probes (slugs) 21 with a concave bottom approach the center conductor 23, they capture the electric field, which is concentrated in the area between the center conductor and the ground planes of the slabline 24, FIG. 2. This field capturing allows creating high and controllable reflection factors. The disadvantage of this technique is the requirement of high precision and resolution cumbersome vertical 26 probe movement mechanisms 33, 34. Because most of the field capturing effect occurs when the probe is very close to the center conductor a high-resolution vertical control mechanism is needed. This, on the other hand, not only slows down the tuning procedure, since, when the probe is away from the center conductor, the tuning effect is much less prominent, but the vertical moving speed is the same (see FIG. 15 in ref. 7), but also requires enhanced positioning accuracy due to high tuning sensitivity in the high reflection area, when the slug is very close to the center conductor.

A further disadvantage of traditional multi-carriage tuners is their linear length. It must be at least one half of a wavelength (λ/2) per carriage, i.e. in the case of a two-carriage (harmonic) tuner this would be one full wavelength. At 400 MHz lowest frequency the total length would be 75 cm. The present invention discloses a structure, whereby the slabline is bottom-less and the disc probes are inserted from opposite sides, sharing the same length of line and allowing a shrinking in length by a factor of 2 (see ref. 3). However, a structure as in ref. 3, still requires cumbersome vertical axes cancelling in tuner width what is gained in length. Therefore the present solution employs disc tuning probes, see ref. 7, which offer a number of advantages, in addition to the elimination of the vertical axes 33, 34.

DESCRIPTION OF PRIOR ART

Disc probes have been disclosed before (see ref. 7); also two-carriage (harmonic) tuners using disc probes have been disclosed (see ref. 6). In ref. 3 a tuner using the slabline sharing concept has been disclosed. However in ref. 3 the tuner is a fundamental tuner i.e. it operates at a single frequency at a time, the probes are used for pre-matching purpose at a single frequency and are not specifically designed to be wideband (in ref. 5 the segmented probes of FIG. 15 are declared "wideband" because each segment covers a different frequency band—Column 3 lines 13-14, in fact the probes of ref. 5, FIG. 15, are "multi-band" not necessarily "wideband"), whereas in this invention the probes are designed for and are by definition wideband and must cover at least one (typically several), octaves (Fmax/Fmin>2) frequency range in order to allow for harmonic tuning. The tuners in refs. 4, 5 and 6 do not use the slabline sharing concept of ref. 3. In this invention the probes are single or dual band discs, designed to be wideband in each of the frequency band and cover several octave's bandwidth and are used in the slabline sharing structure.

Additionally, prior art does not teach a calibration or tuning algorithm, which is not obvious, since, at certain positions of the tuning probes there is overlapping and the tuning sections reverse, which must be considered in the de-embedding calibration. In short, a "shared slabline" tuner structure without the proper calibration is a useless piece of gear since the prior art de-embedding calibration technique (see ref. 4) is not applicable as such, because the probes can change order, i.e. probe #1 can be closest or farthest away from the test port, in which case the method of ref. 4 does not apply. Such calibration has not been disclosed in ref. 3 either. Thus the invention does not simply claim a tuner apparatus, that might seem a logical combination of prior art components, it does claim a tuner system, with a specific calibration method. On the other hand, once the tuner is properly calibrated, prior art tuning methods apply (see ref. 8).

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art: a typical automated transistor load pull test system.

FIG. 2 depicts prior art: a perspective view of relevant dimensions and parameters of the operation of a vertically adjustable RF tuning probe (slug).

FIG. 3 depicts prior art: front view of a two independent carriage/two probe slide screw tuner.

FIG. 4A through 4B depicts prior art: FIG. 4A depicts a traditional cubical probe (slug) in a slabline and FIG. 4B depicts an eccentrically rotating disc-probe.

FIG. 5A through 5B depicts prior art: FIG. 5A depicts a disc-probe with equal channel depth on the periphery rotating eccentrically; FIG. 5B depicts a disc-probe with unequal channel depth on the periphery rotating eccentrically.

FIG. 8A depicts a state wherein the low frequency band segment of the probe is fully engaged; FIG. 8B depicts a state whereby the high frequency band segment of the probe is fully engaged and FIG. 8C depicts a state whereby none of the probe segments is engaged (initialization state).

FIG. 9A through 9D depicts four possible engagement states of the disc probe and associated schematic reflection factor frequency response. FIG. 9A depicts the initialization state; FIG. 9B depicts a partial engagement state of the low frequency segment; FIG. 9C depicts a maximum engagement state of the low frequency segment and FIG. 9D depicts the maximum engagement state of the high frequency segment.

FIG. 11A depicts a cross section; FIG. 11B depicts a top view.

FIG. 13A depicts full penetration of low frequency section; FIG. 13B depicts full penetration of high frequency section; FIG. 13C depicts initialization state (minimum penetration).

DETAILED DESCRIPTION OF THE INVENTION

This invention discloses radio frequency (RF, microwave), computer controlled tuning system comprising at least one electro-mechanical impedance tuner and a calibration method thereof. The tuner uses metallic (conductive) disc-formed RF probes, instead of cubical block-formed probes and two carriages running in parallel along the slabline and inserting the probes from opposite sides into the slot of the slabline in a sharing the same slabline section kind of arrangement. There are two kinds of probes with regard of frequency coverage: single band probes and dual band probes. The single band probes are circular and rotate eccentrically off their geometrical center; the dual band disc-probes have a circular core disc and use sidewalls having perpendicular to each-other elliptical contours (FIG. 11).

Figure 10:
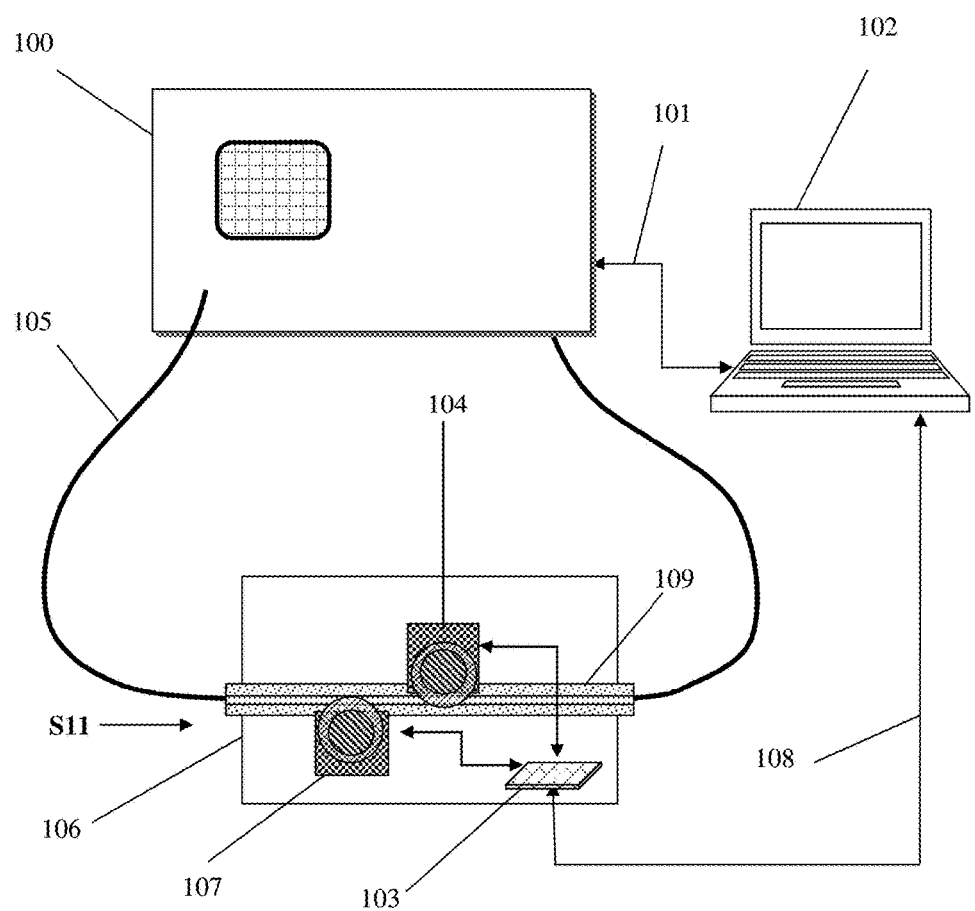
FIG. 10 depicts a tuner calibration setup using VNA and control computer.

The advantages of this new structure are fourfold: (i) shorter tuner length, (ii) higher resolution and tuning speed at high GAMMA, (iii) absence of precision vertical axis and (iv) coverage of two distinct frequency ranges using a single vertical motor and control. Details of the tuner and the probes are discussed in FIGS. 6 to 9 and 11, whereas FIG. 10 shows the tuner calibration setup.

Figure 6:
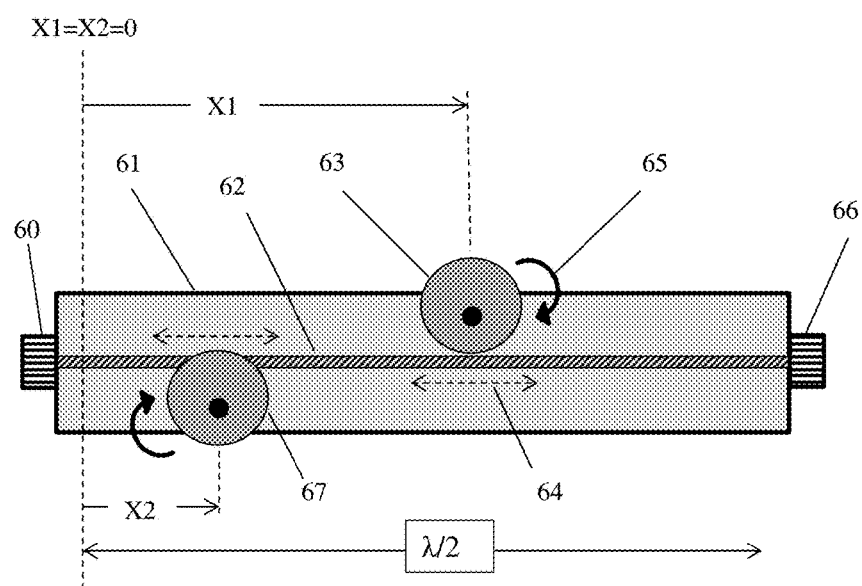
FIG. 6 depicts top view of two-carriage tuner using disc-probes and sharing the same section of λ/2 long slabline.

The overall structure of the new two-carriage harmonic tuner is shown in FIG. 6. The slabline between the test port 60 and idle port 66 has a total length of) λ/2. In a first embodiment two disc probes 67 and 63 rotate 65 eccentrically and penetrate into, or withdraw from, the slot of the slabline approaching the center conductor 62 and controlling the reflection factor 40. FIG. 6 does not show the covering top sidewall of the flat lying slabline 61 in order to make the mechanism visible. Both probes are mounted on carriages (not shown in FIG. 6, but shown in FIG. 7, item 71 and FIG. 10, items 107 and 104) and move also horizontally 64, 72 to control the phase of the reflection factor. During probe movement, care is taken to avoid mechanical conflict between the probes when they cross over the same position of the slabline. This is taken care of by appropriate automated probe movement control algorithm.

Reflection factor control (40 in FIG. 4 and all of FIG. 5) is effectuated by controlling the size of the overlapping areas 51 and 50 between the center conductor 52, 502 when the concentric 53 or non-concentric 56 probes rotate 54, 504 eccentrically around an axis 505 or 55 which is different than the geometrical center 57, 58 of the overall disc probe. The rotation phase F is defined between an axis 59 parallel to the center conductor 52 and the axis 501 connecting the geometrical center 58 with the rotation axis 51. In the case of FIGS. 5A and 5B Φ≈90° and the disc-probe is fully engaged creating maximum reflection. Compared with double elliptic probes (FIG. 8) and oval (egg-) formed probes (FIG. 13) the prior art probes of FIGS. 5A and 5B have the disadvantage that there is not clear distinction between low and high frequency range segment. When the probe 53 or 56 rotates, the only thing it does is capturing larger or smaller amount of electric field and increasing or decreasing the reflection factor at a specific frequency range, but not switching frequency range as it happens between settings in FIGS. 9C and 9D.

Figure 7:
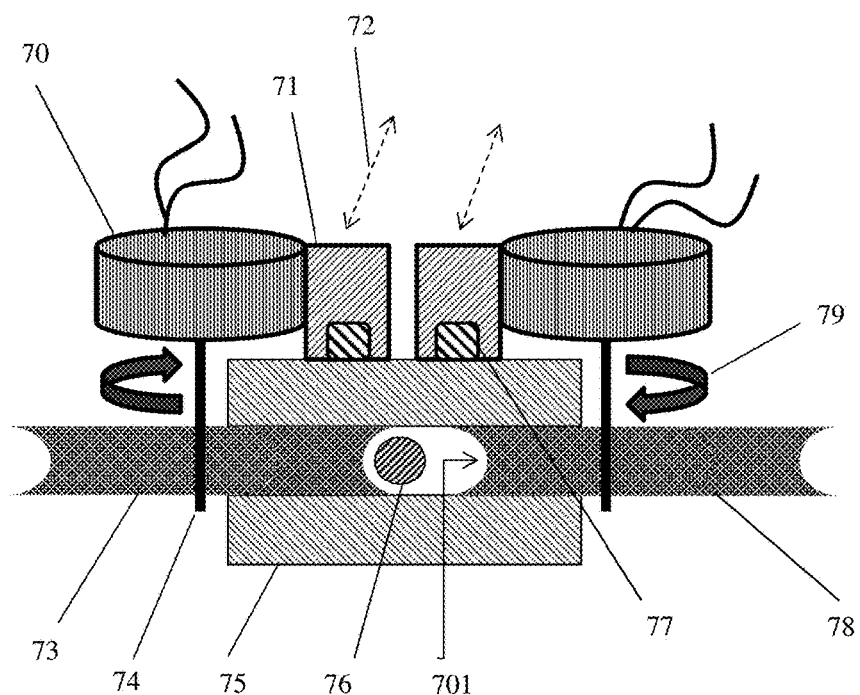
FIG. 7 depicts cross section of horizontal slabline with both disc-probes rotating eccentrically and inserted diametrically in various depths.

A cross section of the two disc-probes inserted into the flat lying slabline is shown in FIG. 7. It is preferable to configure the slabline lying flat instead of vertical for better weight distribution and easiness of mechanical probe control. The two disc-probes 73 and 78 are attached to the axes 74 of the electric stepper motor 70 and rotated 79 into the slot of the slabline 75, approaching to or withdrawing from the center conductor 76. The electric stepper motors 70 are attached to guided 77 sliding carriages 71 which move 72 parallel to the slabline axis controlled by motorized lead screw, timing belt or rack-and-pinion movement control. Coupling of the concave bottom 701 of the probes 78 with the center conductor 76 controls the amplitude of the reflection factor. The horizontal movement 72 controls the phase. The discs slide fit into the slot of the slabline.

Figure 8A:
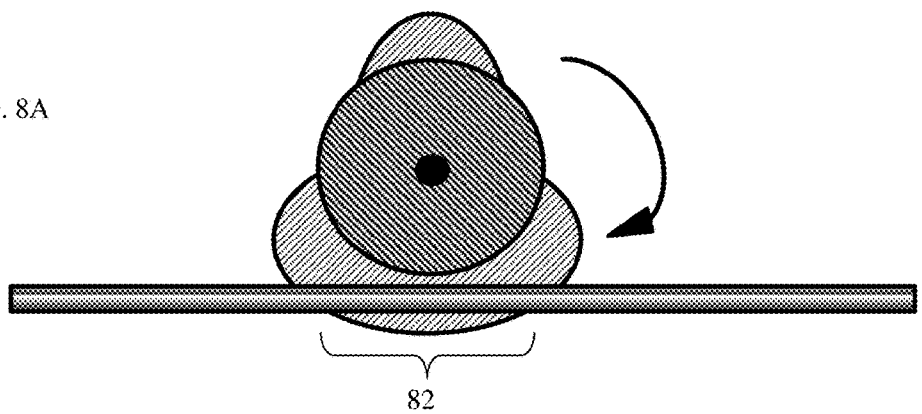
FIG. 8A through 8C depicts three possible states of dual frequency band disc-probe.
Figure 8B:
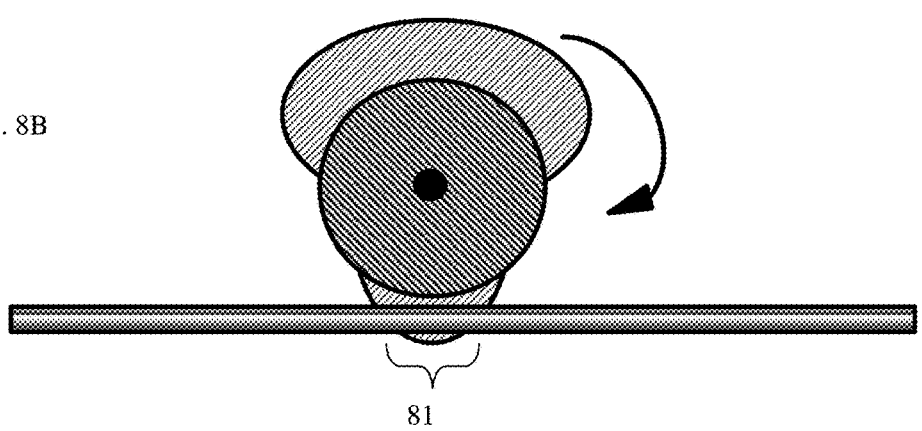
Figure 8C:
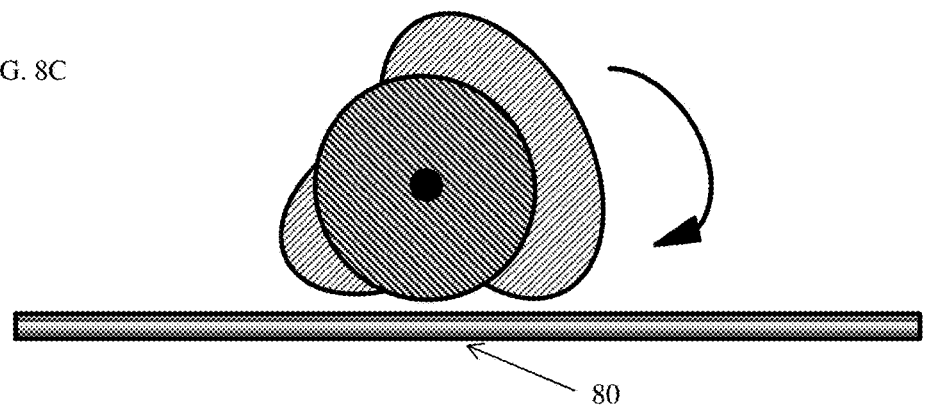

FIG. 8 shows three possible extreme settings of the dual frequency band disc-probe (DBDP): FIG. 8A shows the low frequency probe segment fully engaged 82, meaning maximum reflection at low frequencies, FIG. 8B shows the high frequency segment fully engaged 81, meaning maximum reflection at high frequencies and FIG. 8C shows none of the segments engaged 80, meaning minimum reflection factor overall. What this means in the actual frequency response of the reflection factor is demonstrated in FIG. 9. The initialization state 90 is shown in FIG. 9A: The reflection factor is minimal over the whole frequency range. A partially engaged 91 low frequency segment is shown in FIG. 9B: The reflection factor is medium in the low frequency band only. A fully engaged 92 low frequency segment is shown in FIG. 9C leading to maximum reflection at the low frequency band. Finally a fully engaged 93 high frequency segment is shown in FIG. 9D leading to maximum reflection at the high frequency band.

Figure 11A:
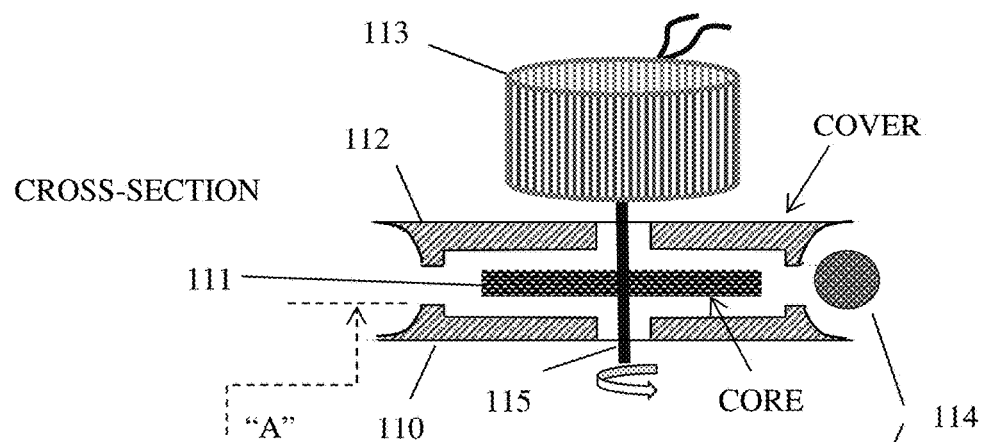
FIG. 11A through 11B depicts views of the structure of the dual band disc probe.
Figure 11B:
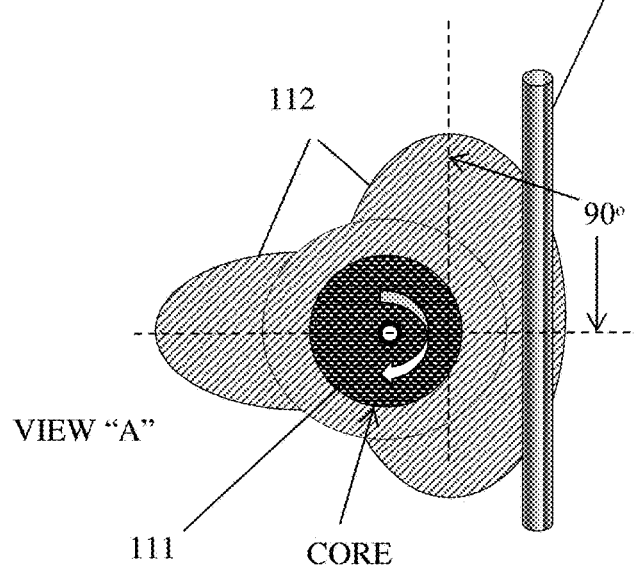

One embodiment of the dual band disc-probe is shown in FIG. 11. The cross section is seen in FIG. 11A: the probe has a core 111 and two covers 110 and 112. The core 111 is attached to the axis 115 of the motor 113 which rotates the probe in a manner as to approach the center conductor 114 closer or further away and thus control the amount of power reflected and the amplitude of the reflection factor. The top view at section "A" is seen in FIG. 11B: Each of the two covers 112 or 110 comprises an integration of two elliptical segments, which are mounted with their main elliptical axes perpendicular on each-other (FIG. 11B. The actual state of the probe relative to the center conductor in FIG. 11B shows a full engagement of the low frequency segment. Other embodiments of the probe are possible without deviating from the basic concept of one circular core and two elliptic covers creating a low frequency and a high frequency segment.

Figure 13A:
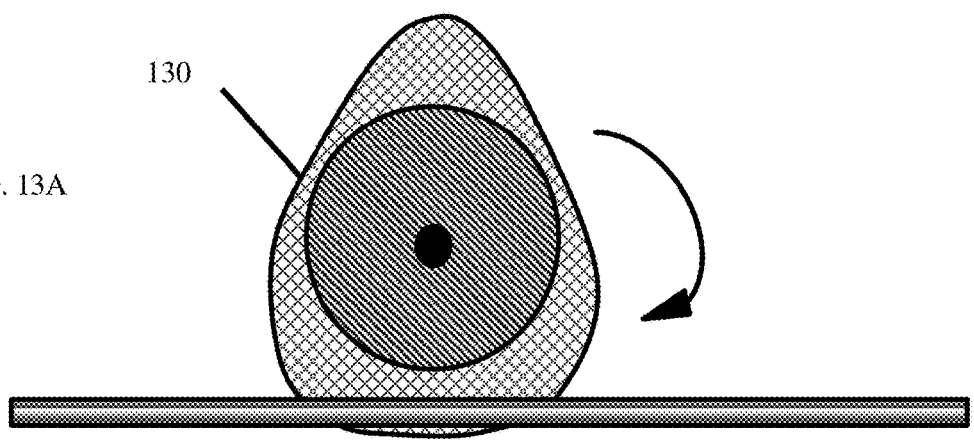
FIG. 13A through 13C depicts disc tuning probe with egg (cam) form.
Figure 13B:
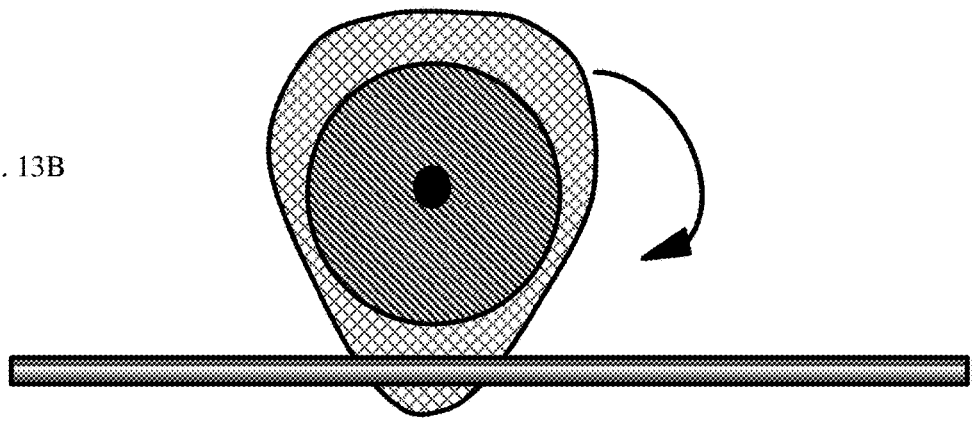
Figure 13C:
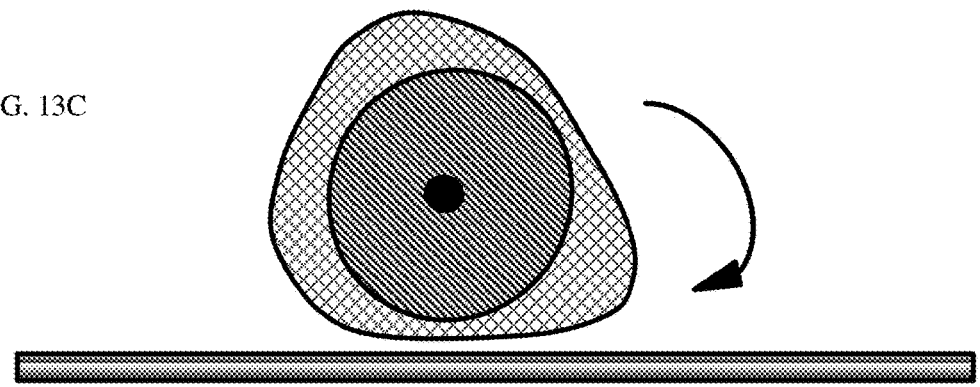

A different disc form is shown in FIG. 13: hereby the circular core 130 is sandwiched between two egg-formed (cam-formed), see ref. 9, sidewalls, which, when engaged (FIGS. 13A and 13B), capture the electric field and create the required reflection. The flat bottom of the cam (FIG. 13A) creates reflection at the low frequency range, whereas the narrow peak (FIG. 13B) creates reflection at the high frequency range. When neither extremity of the cam is engaged (FIG. 13C) the reflection factor is minimum, or, the probe is initialized. Compare also with FIG. 8. Other than in mechanical applications (see ref. 9) the cam rotates around an axis which is approximately at the center of its long axis, because the distance of the core disc must remain constant to the center conductor (FIGS. 13A to 13C).

Figure 12:
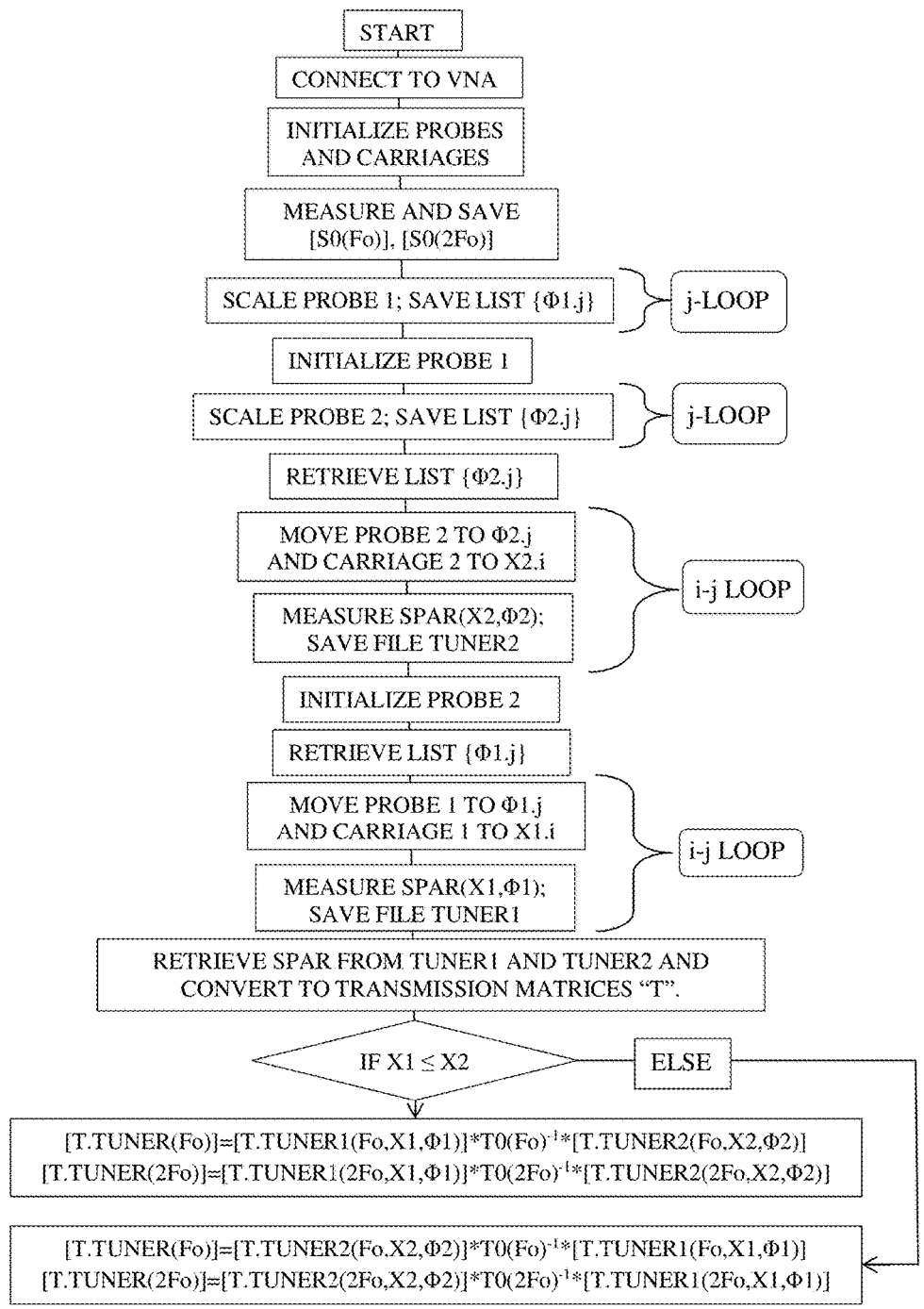
FIG. 12 depicts the flowchart of the calibration procedure.

The tuner calibration process uses a setup as in FIG. 10 and is depicted, step by step, in the flowchart of FIG. 12: the tuner 106 is connected using RF cables 105 with a pre-calibrated VNA 100 at the frequencies of interest, Fo (fundamental) and 2Fo (harmonic); the stepper motors 104 and 107 are directed by the control computer 102 using a digital cable 108 and electronic control board 103 to rotate the disc probes into and out of the slot of the slabline and along the axis of the slabline 109, in order to control the amplitude of the reflection factor GAMMA, while reading the four scattering parameters (s-parameters) from the vector network analyzer (VNA) 100 using standard communication cable 101 and communication protocol. The computer 102 includes a temporary RAM and a permanent (hard-disc) electronic memory for saving probe scaling files in preparation of the calibration process, as well as saving the calibration data files for later use. The PC 102 also comprises and runs appropriate tuner and VNA control and communication software as well as appropriate numerical data processing (s-parameter matrix conversion and cascading) routines.

The calibration procedure comprises two steps: (a) a scaling step and (b) a calibration step. The scaling step (a) serves in collecting information of the amplitude of the reflection factor as a function of rotation angle of each probe at their initial horizontal position, aiming at being able to cover the Smith chart with approximately equidistant GAMMA calibration points forming concentric circles at the fundamental frequency on the Smith chart, starting with an initial position ($\Phi=0°$) corresponding to minimum probe penetration in the slabline slot and ending with full probe penetration ($\Phi=90°$). Such a distribution of calibrated points is optimum for using in prior art impedance synthesis (tuning), routines, see ref. 8. Typical numbers, N1 for probe #1 and N2 for probe #2, of scaling steps corresponding between 10 to 20 rotation angle values $\Phi k.1$ to $\Phi k.Nk$, whereby k=1 (for probe #1) or 2 (for probe #2), corresponding to GAMMA values between minimum and maximum: GAMMA1.min=GAMMA($\Phi 1.1$) and GAMMA1.max=GAMMA($\Phi 1.N1$); GAMMA2.min=GAMMA($\Phi 2.1$) and GAMMA2.max=GAMMA($\Phi 2.N2$). The scaling angles are saved for each probe separately, in scaling lists in the form $\Phi 1.1, \Phi 1.2 \ldots \Phi 1.N1$ and $\Phi 2.1, \Phi 2.2 \ldots \Phi 2.N2$ and are retrieved and used in the calibration step (b) to set the proper rotation angles of the probes, while moving horizontally and measuring s-parameters.

The calibration step (b) serves in collecting data (two-port s-parameters) of the tuner from the VNA covering the reflection factor GAMMA over the entire Smith chart at the test port at the fundamental Fo and harmonic 2Fo frequency. The data are saved in calibration files in the format $Sij(\Phi k.j, Xk.i)$; whereby "$\Phi k.j$" is the relative angle of the rotation of the probe "k" (k=1 or k=2); and Xk.i is the horizontal position "i" of each probe-carrying carriage between an initialization (X1=X2=Xo) position and one half of a wavelength ($\lambda/2$) at the selected fundamental frequency Fo ($\lambda[mm]=300/Fo[GHz]$). The scaling and horizontal movements are executed for each probe based on Fo coordinates and s-parameter data collection is, at each tuner setting at Fo and 2Fo and saved in calibration files for later use.

A "brute force" calibration, corresponding to measuring all probe angle $\Phi k.j$ and horizontal position Xk.i permutations, would amount to hundreds of thousands or even millions of measurements; considering typically 10 angle and 50 carriage positions, or 500 states per probe, leads to at least $500^2 = 250,000$ total states; this would take too long and must be avoided, else the system would be useless. The "de-embedding" calibration technique (see ref. 4) is therefore used, adapted here to disc probes and modified to handle the slabline sharing concept; the problem with the "slabline sharing" concept is that a specific probe can be closer or further away from the test port, in which case "cascading" of tuner sections must be inversed; this must be available for any probe position in real time.

To solve this problem s-parameters of the initialized tuner (both probes withdrawn) are first measured at fundamental (Fo) and harmonic frequency (2Fo) and saved in initialized matrices [S0(Fo)] and [S0(2Fo)]. Subsequently s-parameters of the tuner are measured separately for each probe: while probe #2 is initialized s-parameters are measured for the multitude of probe #1 angle rotation and carriage travel positions and saved. Then the same is applied for probe #2 (with probe #1 initialized) and saved. Finally, and for any Xk.i position, the s-parameters associated with the probe which is further away from the test port are de-embedded (cascaded with the invers matrix $[S0(F)]^{-1}$ whereby F=Fo and F=2Fo), and then cascaded with the raw s-parameters of the probe closest to the test port. This equals to the following procedure: depending if X1≤X2 or X1>X2 (i.e. if probe #1 or probe #2 is closest to the test port, see FIG. 6, the corresponding s-parameters of the probe further away from the test port are de-embedded with $[S0(F)]^{-1}$ at both frequencies F=Fo and F=2Fo and then all permutations are created in memory and saved, to be used later in tuning (impedance synthesis) routines. In terms of transmission (T−) parameter matrices these four relations are:

if (X1<X2) (probe #1 is closer to test port)

$$[T.TUNER(Fo)] = [T.TUNER1(Fo,X1,\Phi1)] * T0(Fo)^{-1} * [T.TUNER2(Fo,X2,41)2)], \quad \{1\}$$

$$[T.TUNER(2Fo)] = [T.TUNER1(2Fo,X1,\Phi1)1)] * T0(2Fo)^{-1} * [T.TUNER2(2Fo,X2,\Phi1)2)]; \quad \{2\}$$

if (X1>X2) (probe #2 is closer to test port)

$$[T.TUNER(Fo)] = [T.TUNER2(Fo,X2,\Phi1)2)] * T0(Fo)^{-1} * [T.TUNER1(Fo,X1,\Phi1)], \quad \{3\}$$

$$[T.TUNER(2Fo)] = [T.TUNER2(2Fo,X2,\Phi2)] * T0(2Fo)^{-1} * [T.TUNER1(2Fo,X1,\Phi1)]; \quad \{4\}$$

whereby [T.TUNER] is the Transmission (T−) matrix version of tuner s-parameter matrix [SPAR] and [T0] is the T-matrix version of [S0] (see ref. 10). The case X1=X2 delivers the same result in both cases. It shall be noticed that the wording in describing matrix multiplication is significant: saying "cascade [A] with [B]" is different than saying "cascade [B] with [A]"; matrix multiplication is not commutative; or [A]*[B]≠[B]*[A] (see ref. 10).

Obvious alternatives to the disclosed concept of rotating disc-shaped RF probes for slide screw tuners are possible but shall not impede on to the validity of the present invention.

What I claim as my invention is:

1. A harmonic impedance tuner system comprising
   a) an automated two carriage slide screw tuner
   b) a system controller, and
   c) a calibration method
   wherein
   a) the tuner comprises
      a slabline between an input port and an output port with two grounded sidewalls and a center conductor;
      and two mobile carriages #1 and #2, sharing the same area of the slabline, remotely controlled using stepper-motors, mounted diametrical on top of the sidewalls, straddling the slot and sliding parallel to the axis of the slabline, said carriages controlling associated disc-shaped tuning probes #1 and #2, said probes rotating inside the slot of the slabline;
   b) the system controller comprises
      a central processor, electronic memory, electronic motor control, communication interface and associated control, communication and data collection software;
   c) the calibration method comprises
      tuner control, s-parameter acquisition routines and data processing algorithms.

2. The tuner of the system of claim 1, comprising communication interface, electronic board, electric stepper motors and gear for controlling the rotation angle of the probes and the position of the carriages along the slabline.

3. The tuner of claim 2,
   wherein
      the total length of the slabline is approximately one half of a wavelength at the minimum operation frequency (Fmin);
   and wherein
      the probes are mounted on the mobile carriages and rotate from opposite sides inside the slot of the slabline, whereby the rotation axis of the probes is perpendicular to the axis of the slabline.

4. The calibration method of the system of claim 1, comprising the following steps:
   a) connecting the tuner to the VNA, which is pre-calibrated at a fundamental frequency Fo and the harmonic frequency 2Fo;
   b) initializing the tuner, i.e. moving the carriages to initial horizontal position (X1=X2=Xo) and rotating the disc-probes to initial angle Φ1=Φ2=0°, for which the reflection factor is minimum;
   c) measuring s-parameters at frequencies Fo and 2Fo and saving in initialization matrices [S0(Fo)] and [S0(2Fo)];
   d) rotating disc-probe #1 progressively into the slot of the slabline at angles Φ1.j, measuring the reflection factor GAMMA1(Φ1.j) at Fo at the test port, at a number N1>2 of angles (1≤j≤N1) and saving in memory;
   e) initializing disc-probes #1; rotating disc-probe #2 progressively into the slot of the slabline at angles Φ2.j; measuring the reflection factor GAMMA2(Φ2.j) at Fo at the test port, at a number N2>2 of angles (1≤j≤N2) and saving in memory;
   f) initializing disc-probe #2 and measuring tuner two-port s-parameters at Fo and 2Fo, for N1 angular probe positions Φ1.j, as defined in step (d), and a multitude of horizontal carriage #1 positions, X1, between the initial position (X1=Xo) and a distance of at least one half of a wavelength at Fo, and saving in file tuner1;
   g) initializing disc-probe #1 and measuring tuner two-port s-parameters at Fo and 2Fo, for N2 angular probe positions Φ2.j, as defined in step (e), and a multitude of horizontal carriage #2 positions, X2, between the initial position (X2=Xo) and a distance of at least one half of a wavelength at Fo, and saving in file tuner2;

h) cascading s-parameters as follows:

if (X1≤X2) then the invers s-parameter matrices $[S0(Fo)]^{-1}$ and $[S0(2Fo)]^{-1}$ are cascaded with s-parameters of file tuner2 at Fo and 2Fo correspondingly and re-saved in file tuner2;

cascade the permutations of s-parameters comprised in files tuner1 and tuner2, as created in steps (f) and (g) and modified in step (h), and save in overall tuner calibration files tuner-cal-Fo and tuner-cal-2Fo;

if (X1>X2) then the invers s-parameter matrices $[S0(Fo)]^{-1}$ and $[S0(2Fo)]^{-1}$ are cascaded with s-parameters of file tuner1 at Fo and 2Fo correspondingly and re-saved in file tuner1;

cascade the permutations of s-parameters comprised in files tuner2 and tuner1, as created in steps (f) and (g) and modified in step (h), and save in overall tuner calibration files tuner-cal-Fo and tuner-cal-2Fo.

\* \* \* \* \*